United States Patent
Chai et al.

(10) Patent No.: US 9,705,495 B2
(45) Date of Patent: Jul. 11, 2017

(54) ASYMMETRIC SENSOR PATTERN

(75) Inventors: Min Chin Chai, Lynnwood, WA (US); Patrick Prendergast, Clinton, WA (US); Massoud Badaye, Sunnyvale, CA (US)

(73) Assignee: Creator Technology B.V., Tilburg (NL)

( * ) Notice: Subject to any disclaimer, the term of this patent is extended or adjusted under 35 U.S.C. 154(b) by 253 days.

(21) Appl. No.: 13/247,922

(22) Filed: Sep. 28, 2011

(65) Prior Publication Data

US 2012/0133611 A1 May 31, 2012

Related U.S. Application Data

(63) Continuation-in-part of application No. 13/198,717, filed on Aug. 5, 2011, now Pat. No. 8,901,944, which is a continuation-in-part of application No. 13/008,014, filed on Jan. 18, 2011, now Pat. No. 9,405,408.

(60) Provisional application No. 61/372,002, filed on Aug. 9, 2010, provisional application No. 61/295,599, filed on Jan. 15, 2010.

(51) Int. Cl.
*G06F 3/044* (2006.01)
*H03K 17/96* (2006.01)

(52) U.S. Cl.
CPC ......... *H03K 17/9622* (2013.01); *G06F 3/044* (2013.01); *H03K 2217/960775* (2013.01)

(58) Field of Classification Search
CPC ......... G06F 3/041; G06F 3/044; G06F 3/047; G01R 27/26; H03K 17/9622; H03K 17/945; H03K 2217/960775
USPC ........................... 345/173–178; 324/650–690
See application file for complete search history.

(56) References Cited

U.S. PATENT DOCUMENTS

| 5,099,386 | A | 3/1992 | Stokes et al. |
| 6,188,391 | B1 | 2/2001 | Seely et al. |
| 6,627,154 | B1 | 9/2003 | Goodman et al. |
| 6,642,857 | B1 | 11/2003 | Schediwy et al. |
| 6,925,611 | B2 | 8/2005 | Sangiovanni |

(Continued)

FOREIGN PATENT DOCUMENTS

| JP | 2010002958 A | 1/2010 |
| KR | 20100031242 A | 3/2010 |
| KR | 20100070964 A | 6/2010 |

OTHER PUBLICATIONS

USPTO Final Rejection for U.S. Appl. No. 13/198,717 dated Apr. 10, 2014; 28 pages.

(Continued)

*Primary Examiner* — Son Le
*Assistant Examiner* — Brent J Andrews
(74) *Attorney, Agent, or Firm* — Jianq Chyun IP Office

(57) ABSTRACT

An embodiment of a capacitive sensor array may comprise a first plurality of sensor elements and a second sensor element comprising a main trace that intersects each of the first plurality of sensor elements to form a plurality of intersections. A unit cell may be associated with each of the intersections, and each unit cell may designate a set of locations nearest to a corresponding intersection. A contiguous section of the main trace may cross at least one of the plurality of unit cells. The capacitive sensor array may further comprise a plurality of open zones, where each of the plurality of open zones is staggered relative to an adjacent open zone.

11 Claims, 5 Drawing Sheets

(56) References Cited

U.S. PATENT DOCUMENTS

| | | | |
|---|---|---|---|
| 7,030,860 B1 | 4/2006 | Hsu et al. | |
| 7,129,935 B2 | 10/2006 | Mackey | |
| 7,202,859 B1* | 4/2007 | Speck et al. | 345/174 |
| 7,453,270 B2 | 11/2008 | Hargreaves et al. | |
| 7,463,246 B2 | 12/2008 | Mackey | |
| 7,663,607 B2 | 2/2010 | Hotelling et al. | |
| 7,741,896 B2 | 6/2010 | Chow et al. | |
| 7,808,255 B2 | 10/2010 | Hristov et al. | |
| 7,859,521 B2 | 12/2010 | Hotelling et al. | |
| 7,920,129 B2 | 4/2011 | Hotelling et al. | |
| 7,932,898 B2 | 4/2011 | Philipp et al. | |
| 7,940,251 B2 | 5/2011 | Hashida | |
| 7,965,281 B2 | 6/2011 | Mackey | |
| 8,217,916 B2 | 7/2012 | Anno | |
| 8,410,795 B1 | 4/2013 | Peng et al. | |
| 8,525,799 B1 | 9/2013 | Grivna et al. | |
| 2002/0015024 A1 | 2/2002 | Westerman et al. | |
| 2002/0098119 A1 | 7/2002 | Goodman | |
| 2004/0119701 A1 | 6/2004 | Mulligan et al. | |
| 2004/0130336 A1 | 7/2004 | Picollet et al. | |
| 2004/0252109 A1* | 12/2004 | Trent et al. | 345/174 |
| 2006/0097991 A1 | 5/2006 | Hotelling et al. | |
| 2007/0008299 A1 | 1/2007 | Hristov | |
| 2007/0057167 A1* | 3/2007 | MacKey et al. | 250/221 |
| 2007/0074914 A1 | 4/2007 | Geaghan et al. | |
| 2007/0139395 A1 | 6/2007 | Westerman et al. | |
| 2007/0176608 A1 | 8/2007 | Mackey et al. | |
| 2007/0229470 A1* | 10/2007 | Snyder | G06F 3/011 345/173 |
| 2008/0006453 A1 | 1/2008 | Hotelling | |
| 2008/0007534 A1 | 1/2008 | Peng et al. | |
| 2008/0048997 A1 | 2/2008 | Gillespie et al. | |
| 2008/0111795 A1* | 5/2008 | Bollinger | 345/173 |
| 2008/0225015 A1 | 9/2008 | Hashida | |
| 2008/0246496 A1 | 10/2008 | Hristov et al. | |
| 2008/0264699 A1 | 10/2008 | Chang et al. | |
| 2008/0278178 A1 | 11/2008 | Philipp | |
| 2008/0309633 A1 | 12/2008 | Hotelling et al. | |
| 2009/0051863 A1 | 2/2009 | Meisner | |
| 2009/0159344 A1 | 6/2009 | Hotelling et al. | |
| 2009/0262092 A1 | 10/2009 | Halsey et al. | |
| 2009/0273570 A1* | 11/2009 | Degner et al. | 345/173 |
| 2009/0309616 A1* | 12/2009 | Klinghult et al. | 324/686 |
| 2010/0020032 A1 | 1/2010 | Mamba et al. | |
| 2010/0026655 A1 | 2/2010 | Harley | |
| 2010/0044122 A1 | 2/2010 | Sleeman et al. | |
| 2010/0045632 A1 | 2/2010 | Yilmaz et al. | |
| 2010/0059294 A1 | 3/2010 | Elias et al. | |
| 2010/0110038 A1 | 5/2010 | Mo et al. | |
| 2010/0128002 A1 | 5/2010 | Stacy et al. | |
| 2010/0156811 A1 | 6/2010 | Long et al. | |
| 2010/0164881 A1 | 7/2010 | Kuo et al. | |
| 2010/0182275 A1 | 7/2010 | Saitou | |
| 2010/0201633 A1 | 8/2010 | Mozdzyn et al. | |
| 2010/0224424 A1 | 9/2010 | Kasajima | |
| 2010/0231555 A1 | 9/2010 | Mackey | |
| 2010/0292945 A1 | 11/2010 | Reynolds et al. | |
| 2010/0302201 A1 | 12/2010 | Ritter et al. | |
| 2010/0302206 A1 | 12/2010 | Yu et al. | |
| 2010/0328255 A1 | 12/2010 | Ishizaki et al. | |
| 2011/0001723 A1 | 1/2011 | Fan | |
| 2011/0012842 A1 | 1/2011 | Lee et al. | |
| 2011/0261003 A1 | 10/2011 | Lee et al. | |
| 2011/0316567 A1 | 12/2011 | Chai et al. | |
| 2012/0044193 A1 | 2/2012 | Peng et al. | |
| 2012/0044198 A1 | 2/2012 | Chai et al. | |
| 2012/0133611 A1 | 5/2012 | Chai et al. | |
| 2012/0229417 A1 | 9/2012 | Badaye | |
| 2013/0169582 A1 | 7/2013 | Ryshtun | |

OTHER PUBLICATIONS

U.S. Appl. No. 13/198,717: "Lattice Structure for Capacitance Sensing Electrodes" Min Chin Chai et al.., filed Aug. 5, 2011; 45 pages.

Barrett, G. Projected-Capacitive Touch Technology. Information Display [online]. Mar. 2010,vol. 26 No. 3, p. 16-21 [retrieved on Aug. 4, 2011]. Retrieved from the Internet<URL:http://walkermobile.com/March_2010_Information_Display_Magazine.pdf>.

International Search Report and Written Opinion of the International Searching Authority for International Application No. PCT/US11/47094 dated Feb. 23, 2012; 8 pages.

Lee, M. The Art of Capacitive Touch Sensing. EE Times, Design Article [online]. Mar. 1, 2006 [retrieved on Aug. 4, 2011]. Retrieved from the Internet<URL:http://www.etimes.com/design/analog-design/4009622/The-art-of-capacitive-touch-sensing>.

USPTO Non-Final Rejection for U.S. Appl. No. 13/198,2014 dated Jan. 22, 2014; 27 pages.

U.S. Appl. No. 14/557,254: "Lattice Structure for Capacitance Sensing Electrodes," Min Chin Chai, filed Dec. 1, 2014; 44 pages.

Gary Barrett and Ryomei Omote, Projected-Capacitive Touch Technology, Frontline Technology, Information Display 26, No. 3, Mar. 2010.

Jing Wu, et al., "A High Sensitivity Capacitive Fingerprint Sensor with Double Sensing Plates", IEEE Xplore, Oct. 2004; accessed from http://ieeexplore.ieee.org/xpl/freeabs_all.jsp?reload=true&arnumber=1436920 ; 4 pages.

Otmar Hilliges, Bringing the Physical to the Digital: A New Model for Tabletop Interaction, LMU, Munchen 2009.

Paul Dietz and Darren Leigh, DiamondTouch: a multi-user touch technology, UIST '01 Proceedings of the 14th annual ACM symposium on User interface software and technology, pp. 219-226, New York, NY, USA 2001.

SIPO Office Action for Application No. 201180002808.8 dated May 5, 2015; 3 pages.

USPTO Advisory Action for U.S. Appl. No. 13/008,014 dated Mar. 20, 2015; 3 pages.

USPTO Advisory Action for U.S. Appl. No. 13/198,2014 dated Jul. 21, 2014; 5 pages.

USPTO Final Rejection for U.S. Appl. No. 13/008,014 dated Jan. 2, 2015; 14 pages.

USPTO Non-Final Rejection for U.S. Appl. No. 13/008,014 dated May 8, 2015; 14 pages.

USPTO Non-Final Rejection for U.S. Appl. No. 13/008,014 dated Aug. 19, 2014; 12 pages.

USPTO Notice of Allowance for U.S. Appl. No. 13/198,2014 dated Aug. 19, 2014; 8 pages.

USPTO Notice of Allowance for U.S. Appl. No. 13/198,2014 dated Sep. 18, 2014; 8 pages.

* cited by examiner

ASYMMETRIC SENSOR PATTERN

RELATED APPLICATIONS

This application is a continuation in part of U.S. application Ser. No. 13/198,717, filed on Aug. 5, 2011, which claims priority to U.S. Provisional Application No. 61/372,002, filed on Aug. 9, 2010, and which is a continuation in part of U.S patent application Ser. No. 13/008,014, filed on Jan. 18, 2011, which claims priority to U.S. Provisional Application No. 61/295,599, filed on Jan. 15, 2010, all of which are hereby incorporated by reference.

TECHNICAL FIELD

This disclosure relates to the field of touch-sensors and, in particular, to trace patterns of elements in capacitive touch-sensor arrays.

BACKGROUND

Computing devices, such as notebook computers, personal data assistants (PDAs), kiosks, and mobile handsets, have user interface devices, which are also known as human interface devices (HID). One user interface device that has become more common is a touch-sensor pad (also commonly referred to as a touchpad). A basic notebook computer touch-sensor pad emulates the function of a personal computer (PC) mouse. A touch-sensor pad is typically embedded into a PC notebook for built-in portability. A touch-sensor pad replicates mouse X/Y movement by using two defined axes which contain a collection of sensor elements that detect the position of one or more conductive objects, such as a finger. Mouse right/left button clicks can be replicated by two mechanical buttons, located in the vicinity of the touchpad, or by tapping commands on the touch-sensor pad itself. The touch-sensor pad provides a user interface device for performing such functions as positioning a pointer, or selecting an item on a display. These touch-sensor pads may include multi-dimensional sensor arrays for detecting movement in multiple axes. The sensor array may include a one-dimensional sensor array, detecting movement in one axis. The sensor array may also be two dimensional, detecting movements in two axes.

Another user interface device that has become more common is a touch screen. Touch screens, also known as touchscreens, touch windows, touch panels, or touchscreen panels, are transparent display overlays which are typically either pressure-sensitive (resistive or piezoelectric), electrically-sensitive (capacitive), acoustically-sensitive (surface acoustic wave (SAW)) or photo-sensitive (infra-red). The effect of such overlays allows a display to be used as an input device, removing the keyboard and/or the mouse as the primary input device for interacting with the display's content. Such displays can be attached to computers or, as terminals, to networks. Touch screens have become familiar in retail settings, on point-of-sale systems, on ATMs, on mobile handsets, on kiosks, on game consoles, and on PDAs where a stylus is sometimes used to manipulate the graphical user interface (GUI) and to enter data. A user can touch a touch screen or a touch-sensor pad to manipulate data. For example, a user can apply a single touch, by using a finger to touch the surface of a touch screen, to select an item from a menu.

BRIEF DESCRIPTION OF THE DRAWINGS

The present disclosure is illustrated by way of example, and not by way of limitation, in the figures of the accompanying drawings.

DETAILED DESCRIPTION

Figure 1:
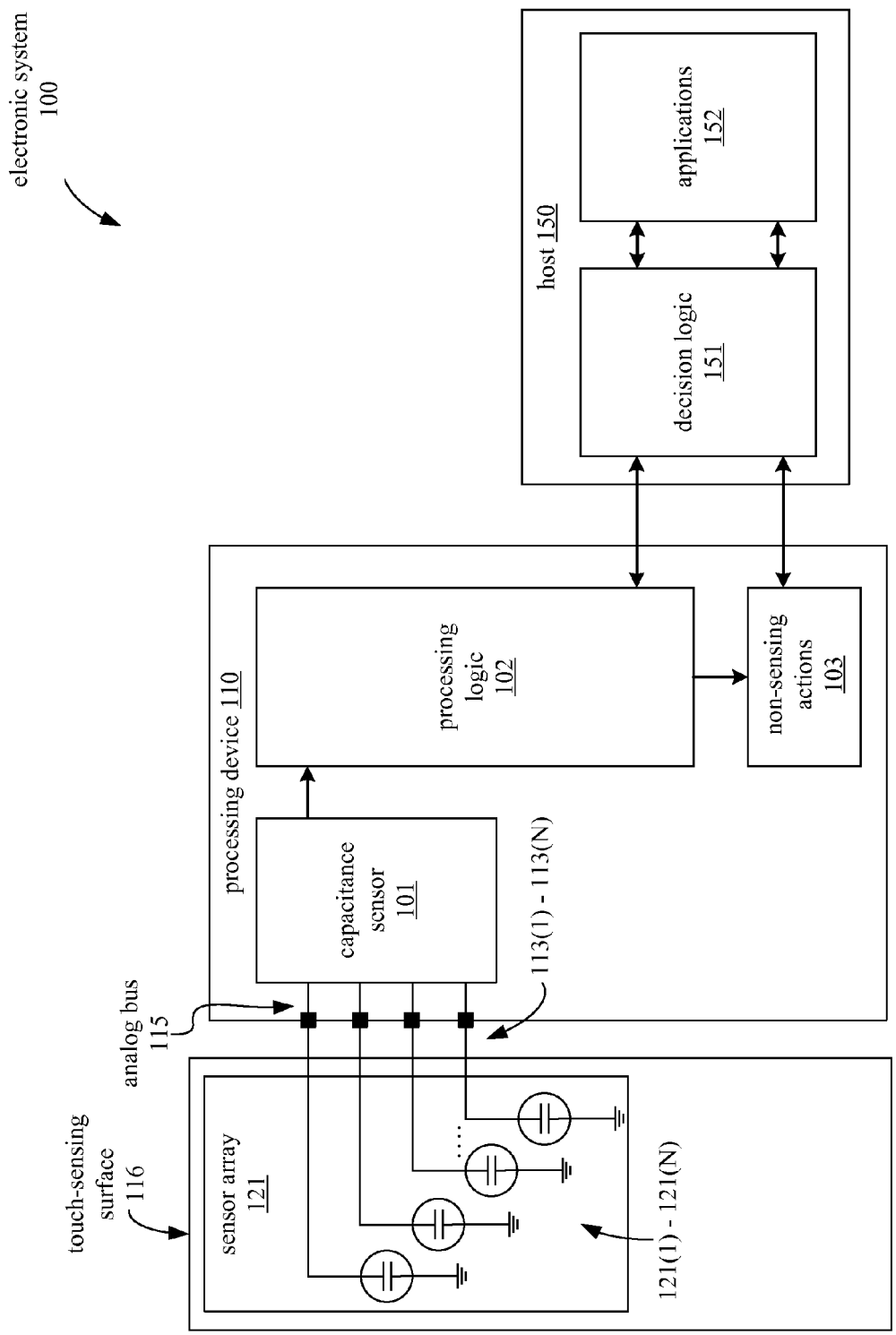
FIG. 1 is a block diagram illustrating an embodiment of an electronic system that processes touch sensor data.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

An embodiment of a capacitive sensor array may include sensor elements arranged such that each unit cell corresponding to an intersection between sensor elements may include one or more open zones, where each open zone is a relatively large area that includes portions of only one sensor element. In one embodiment, such open zones may have decreased sensitivity when detecting the presence of an object because of a lower density of fringing electric field lines, relative to other areas of the capacitive sensor array.

In one embodiment, the open zones in a capacitive sensor array may be arranged in a staggered layout, such that adjacent open zones are centered on alternate sides of a central axis. In one embodiment, a capacitive sensor array may include one or more sensor elements having a main trace and one or more primary subtraces branching away from the main trace, and the open zones may be formed by relatively large areas that are not occupied by any main traces or subtraces.

In one embodiment, the pattern of sensor elements may create one or more open zones that are situated entirely within a unit cell, or may span multiple unit cells. In one embodiment, an open zone is a two-dimensional area containing portions of only one sensor element. In one embodiment, the bounds of an open zone may be understood as being delineated by the largest convex polygon that can be inscribed in a relatively large area that contains portions of only one sensor element.

In one embodiment, a sensor array having such a pattern may have decreased signal disparity and reduced manufacturability problems as compared to other patterns, such as a diamond pattern. Specifically, a capacitive sensor array with sensor elements having main traces and subtraces branching from the main trace, may be manufactured with decreased cost and increased yield rate, as well as improved optical quality.

An embodiment of such a capacitive sensor array may include a first and a second plurality of sensor elements each intersecting each of the first plurality of sensor elements. Each intersection between one of the first plurality of sensor elements and one of the second plurality of sensor elements may be associated with a corresponding unit cell. In one embodiment, a unit cell corresponding to an intersection may be understood as an area including all locations on the surface of the sensor array that are nearer to the corresponding intersection than to any other intersection between sensor elements.

In one embodiment of a capacitive sensor array, each of the second plurality of sensor elements includes a main trace that crosses at least one of the plurality of unit cells, and further includes, within each unit cell, a primary subtrace that branches away from the main trace. In one embodiment, the primary subtraces may branch asymmetrically from the main trace.

In one embodiment, a capacitive sensor array having staggered open zones or an asymmetric trace pattern may have a more uniform detection sensitivity when detecting the proximity of an object that is moving along a substantially straight path. For example, a finger that traces a straight line over a sensor array having open zones that are not staggered may pass over a series of adjacent open zones, which may result in difficulty in tracking the movement of the object due to the lower sensitivity of the open zones. For a capacitive sensor having a staggered arrangement of open zones a straight path is more likely to pass over an equal number of open zones and higher sensitivity zones.

FIG. 1 illustrates a block diagram of one embodiment of an electronic system 100 including a processing device 110 that may be configured to measure capacitances from a touch sensing surface 116 including a capacitive sensor array as described above. The electronic system 100 includes a touch-sensing surface 116 (e.g., a touchscreen, or a touch pad) coupled to the processing device 110 and a host 150. In one embodiment, the touch-sensing surface 116 is a two-dimensional user interface that uses a sensor array 121 to detect touches on the surface 116.

In one embodiment, the sensor array 121 includes sensor elements 121(1)-121(N) (where N is a positive integer) that are disposed as a two-dimensional matrix (also referred to as an XY matrix). The sensor array 121 is coupled to pins 113(1)-113(N) of the processing device 110 via one or more analog buses 115 transporting multiple signals. In this embodiment, each sensor element 121(1)-121(N) is represented as a capacitor.

In one embodiment, the capacitance sensor 101 may include a relaxation oscillator or other means to convert a capacitance into a measured value. The capacitance sensor 101 may also include a counter or timer to measure the oscillator output. The processing device 110 may further include software components to convert the count value (e.g., capacitance value) into a sensor element detection decision (also referred to as switch detection decision) or relative magnitude. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the capacitance sensor 101 may be evaluating other measurements to determine the user interaction. For example, in the capacitance sensor 101 having a sigma-delta modulator, the capacitance sensor 101 is evaluating the ratio of pulse widths of the output, instead of the raw counts being over or under a certain threshold.

In one embodiment, the processing device 110 further includes processing logic 102. Operations of the processing logic 102 may be implemented in firmware; alternatively, it may be implemented in hardware or software. The processing logic 102 may receive signals from the capacitance sensor 101, and determine the state of the sensor array 121, such as whether an object (e.g., a finger) is detected on or in proximity to the sensor array 121 (e.g., determining the presence of the object), where the object is detected on the sensor array (e.g., determining the location of the object), tracking the motion of the object, or other information related to an object detected at the touch sensor.

In another embodiment, instead of performing the operations of the processing logic 102 in the processing device 110, the processing device 110 may send the raw data or partially-processed data to the host 150. The host 150, as illustrated in FIG. 1, may include decision logic 151 that performs some or all of the operations of the processing logic 102. Operations of the decision logic 151 may be implemented in firmware, hardware, software, or a combination thereof. The host 150 may include a high-level Application Programming Interface (API) in applications 152 that perform routines on the received data, such as compensating for sensitivity differences, other compensation algorithms, baseline update routines, start-up and/or initialization routines, interpolation operations, or scaling operations. The operations described with respect to the processing logic 102 may be implemented in the decision logic 151, the applications 152, or in other hardware, software, and/or firmware external to the processing device 110. In some other embodiments, the processing device 110 is the host 150.

In another embodiment, the processing device 110 may also include a non-sensing actions block 103. This block 103 may be used to process and/or receive/transmit data to and from the host 150. For example, additional components may be implemented to operate with the processing device 110 along with the sensor array 121 (e.g., keyboard, keypad, mouse, trackball, LEDs, displays, or other peripheral devices).

The processing device 110 may reside on a common carrier substrate such as, for example, an integrated circuit (IC) die substrate, or a multi-chip module substrate. Alternatively, the components of the processing device 110 may be one or more separate integrated circuits and/or discrete components. In one embodiment, the processing device 110 may be the Programmable System on a Chip (PSoC™) processing device, developed by Cypress Semiconductor Corporation, San Jose, Calif. Alternatively, the processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, the processing device 110 may be a network processor having multiple processors including a core unit and multiple micro-engines. Additionally, the processing device 110 may include any combination of general-purpose processing device(s) and special-purpose processing device(s).

In one embodiment, the electronic system 100 is implemented in a device that includes the touch-sensing surface 116 as the user interface, such as handheld electronics, portable telephones, cellular telephones, notebook computers, personal computers, personal data assistants (PDAs), kiosks, keyboards, televisions, remote controls, monitors, handheld multi-media devices, handheld video players, gaming devices, control panels of a household or industrial appliances, or other computer peripheral or input devices. Alternatively, the electronic system 100 may be used in other types of devices. It should be noted that the components of electronic system 100 may include all the components described above. Alternatively, electronic system 100 may include only some of the components described above, or include additional components not listed herein.

Figure 2:
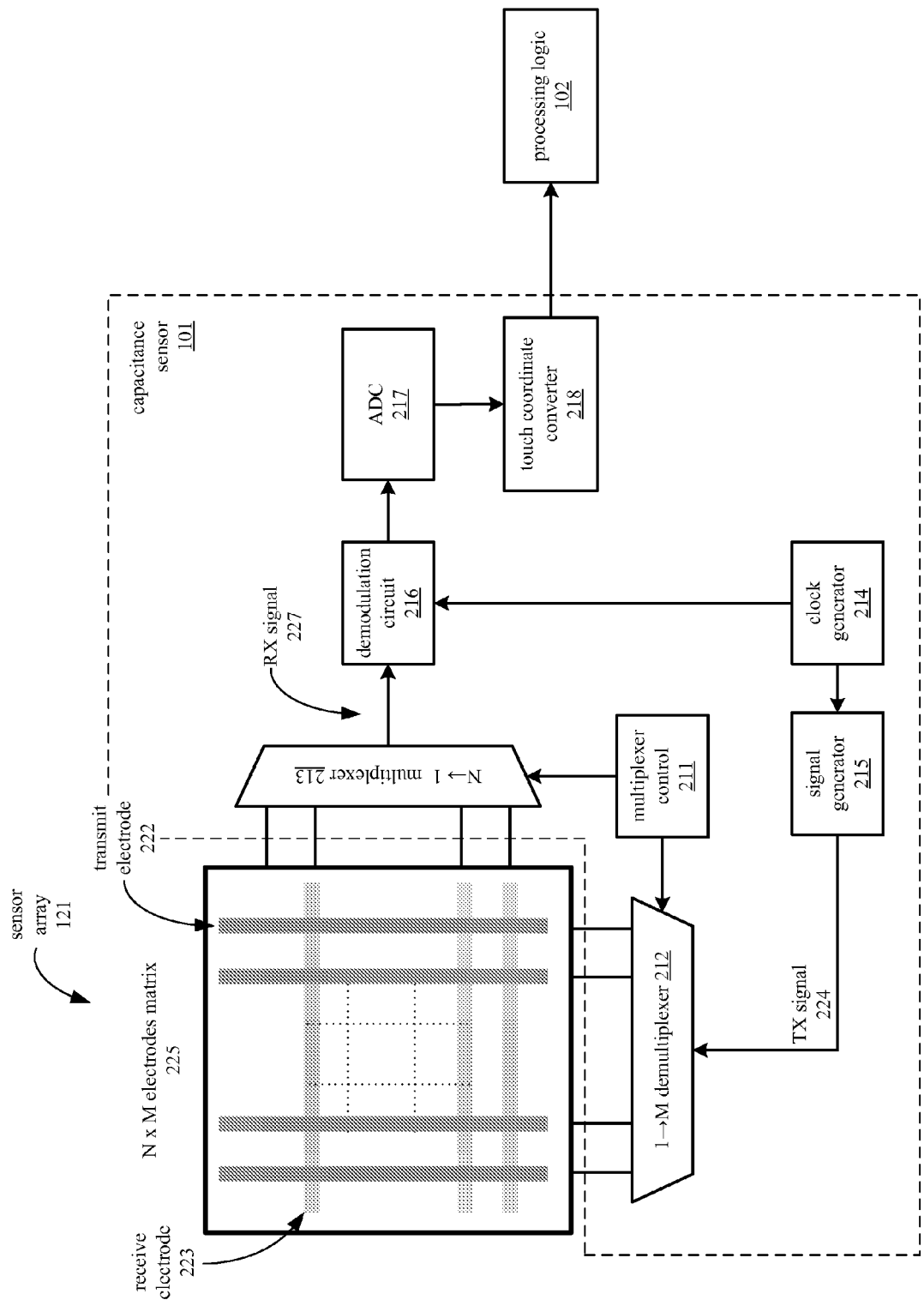
FIG. 2 is a block diagram illustrating an embodiment of an electronic system that processes touch sensor data.

FIG. 2 is a block diagram illustrating one embodiment of a capacitive touch sensor array 121 and a capacitance sensor 101 that converts changes in measured capacitances to coordinates indicating the presence and location of touch. The coordinates are calculated based on changes in measured capacitances relative to the capacitances of the same touch sensor array 121 in an un-touched state. In one embodiment, sensor array 121 and capacitance sensor 101 are implemented in a system such as electronic system 100. Sensor array 220 includes a matrix 225 of N×M electrodes (N receive electrodes and M transmit electrodes), which further includes transmit (TX) electrode 222 and receive (RX) electrode 223. Each of the electrodes in matrix 225 is connected with capacitance sensing circuit 201 through demultiplexer 212 and multiplexer 213.

Capacitance sensor 101 includes multiplexer control 211, demultiplexer 212 and multiplexer 213, clock generator 214, signal generator 215, demodulation circuit 216, and analog to digital converter (ADC) 217. ADC 217 is further coupled with touch coordinate converter 218. Touch coordinate converter 218 may be implemented in the processing logic 102.

The transmit and receive electrodes in the electrode matrix 225 may be arranged so that each of the transmit electrodes overlap and cross each of the receive electrodes such as to form an array of intersections, while maintaining galvanic isolation from each other. Thus, each transmit electrode may be capacitively coupled with each of the receive electrodes. For example, transmit electrode 222 is capacitively coupled with receive electrode 223 at the point where transmit electrode 222 and receive electrode 223 overlap.

Clock generator 214 supplies a clock signal to signal generator 215, which produces a TX signal 224 to be supplied to the transmit electrodes of touch sensor 121. In one embodiment, the signal generator 215 includes a set of switches that operate according to the clock signal from clock generator 214. The switches may generate a TX signal 224 by periodically connecting the output of signal generator 215 to a first voltage and then to a second voltage, wherein said first and second voltages are different.

The output of signal generator 215 is connected with demultiplexer 212, which allows the TX signal 224 to be applied to any of the M transmit electrodes of touch sensor 121. In one embodiment, multiplexer control 211 controls demultiplexer 212 so that the TX signal 224 is applied to each transmit electrode 222 in a controlled sequence. Demultiplexer 212 may also be used to ground, float, or connect an alternate signal to the other transmit electrodes to which the TX signal 224 is not currently being applied. In an alternate embodiment the TX signal 224 may be presented in a true form to a subset of the transmit electrodes 222 and in complement form to a second subset of the transmit electrodes 222, wherein there is no overlap in members of the first and second subset of transmit electrodes 222.

Because of the capacitive coupling between the transmit and receive electrodes, the TX signal 224 applied to each transmit electrode induces a current within each of the receive electrodes. For instance, when the TX signal 224 is applied to transmit electrode 222 through demultiplexer 212, the TX signal 224 induces an RX signal 227 on the receive electrodes in matrix 225. The RX signal 227 on each of the receive electrodes can then be measured in sequence by using multiplexer 213 to connect each of the N receive electrodes to demodulation circuit 216 in sequence.

The mutual capacitance associated with each intersection between a TX electrode and an RX electrode can be sensed by selecting every available combination of TX electrode and an RX electrode using demultiplexer 212 and multiplexer 213. To improve performance, multiplexer 213 may also be segmented to allow more than one of the receive electrodes in matrix 225 to be routed to additional demodulation circuits 216. In an optimized configuration, wherein there is a 1-to-1 correspondence of instances of demodulation circuit 216 with receive electrodes, multiplexer 213 may not be present in the system.

When an object, such as a finger, approaches the electrode matrix 225, the object causes a decrease in the measured mutual capacitance between only some of the electrodes. For example, if a finger is placed near the intersection of transmit electrode 222 and receive electrode 223, the presence of the finger will decrease the charge coupled between electrodes 222 and 223. Thus, the location of the finger on the touchpad can be determined by identifying the one or more receive electrodes having a decrease in measured mutual capacitance in addition to identifying the transmit electrode to which the TX signal 224 was applied at the time the decrease in capacitance was measured on the one or more receive electrodes.

By determining the mutual capacitances associated with each intersection of electrodes in the matrix 225, the presence and locations of one or more conductive objects may be determined. The determination may be sequential, in parallel, or may occur more frequently at commonly used electrodes.

In alternative embodiments, other methods for detecting the presence of a finger or other conductive object may be used where the finger or conductive object causes an increase in measured capacitance at one or more electrodes, which may be arranged in a grid or other pattern. For example, a finger placed near an electrode of a capacitive sensor may introduce an additional capacitance to ground that increases the total capacitance between the electrode and ground. The location of the finger can be determined based on the locations of one or more electrodes at which a change in measured capacitance is detected.

The induced current signal 227 is integrated by demodulation circuit 216. The rectified current output by demodulation circuit 216 can then be filtered and converted to a digital code by ADC 217.

A series of such digital codes measured from adjacent sensor or intersections may be converted to touch coordinates indicating a position of an input on touch sensor array 121 by touch coordinate converter 218. The touch coordinates may then be used to detect gestures or perform other functions by the processing logic 102.

In one embodiment, the capacitance sensor 101 can be configured to detect multiple touches. One technique for the detection and location resolution of multiple touches uses a two-axis implementation: one axis to support rows and another axis to support columns. Additional axes, such as a diagonal axis, implemented on the surface using additional layers, can allow resolution of additional touches.

Figure 3:
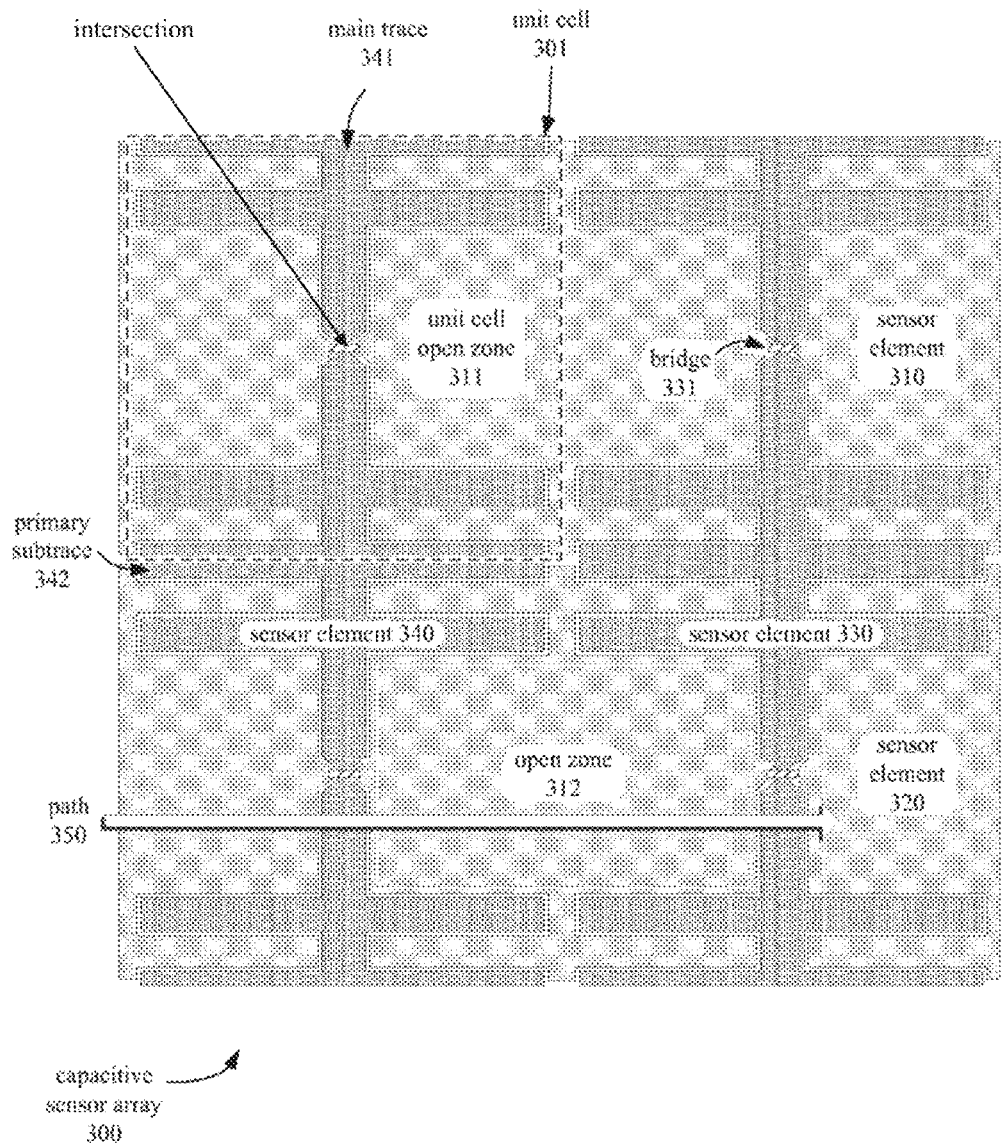
FIG. 3 illustrates an embodiment of a capacitive sensor array having open zones.

FIG. 3 illustrates four unit cells of a capacitive sensor array 300, including sensor elements 310 and 320 that intersect with sensor elements 330 and 340. In one embodiment, the sensor elements 330 and 340 may be RX sensor elements and the sensor elements 310 and 320 may be TX sensor elements. In one embodiment, bridges or jumpers, such as bridge 331, may be used to connect portions of the TX sensor elements 310 and 320. Each of the sensor elements 330 and 340 may include a main trace and at least one primary subtrace, such as main trace 341 and primary subtrace 342 of sensor element 340.

The trace pattern of the capacitive sensor array 300 may also include a plurality of open zones, such as open zones 311 and 312. In one embodiment, the design of the trace pattern may result in one or more open zones within each unit cell. Open zone 311 illustrates the boundaries of an open zone that is defined as being contained within one unit cell. In one embodiment, open zones may span multiple adjacent unit cells, as illustrated by open zone 312. Generally, an open zone may be used to designate an area of the pattern within a unit cell where sensitivity is decreased. For example, a stylus or other object moving over the open zone may result in a lower magnitude signal as compared to the same object moving over an area of the sensor array that is not in an open zone.

In one embodiment, an open zone may be delineated by the largest convex polygon that can be inscribed within a relatively large contiguous area of a single sensor element within a unit cell. For example, the boundaries of open zone 311 may be defined by a rectangle containing portions of only sensor element 310 that are within the unit cell 301. In other embodiments, open zones may be delineated by other convex polygons, such as triangles or other n-gons.

In one embodiment, a straight path 350 of an object moving across the surface of capacitive sensor array 300 may, depending on its position, cross through a number of successive open zones, including open zone 312 and other open zones of sensor element 320. In this situation, the movement of the object along path 350 may be less accurately tracked due to the decreased sensitivity of the open zones.

Figure 4:
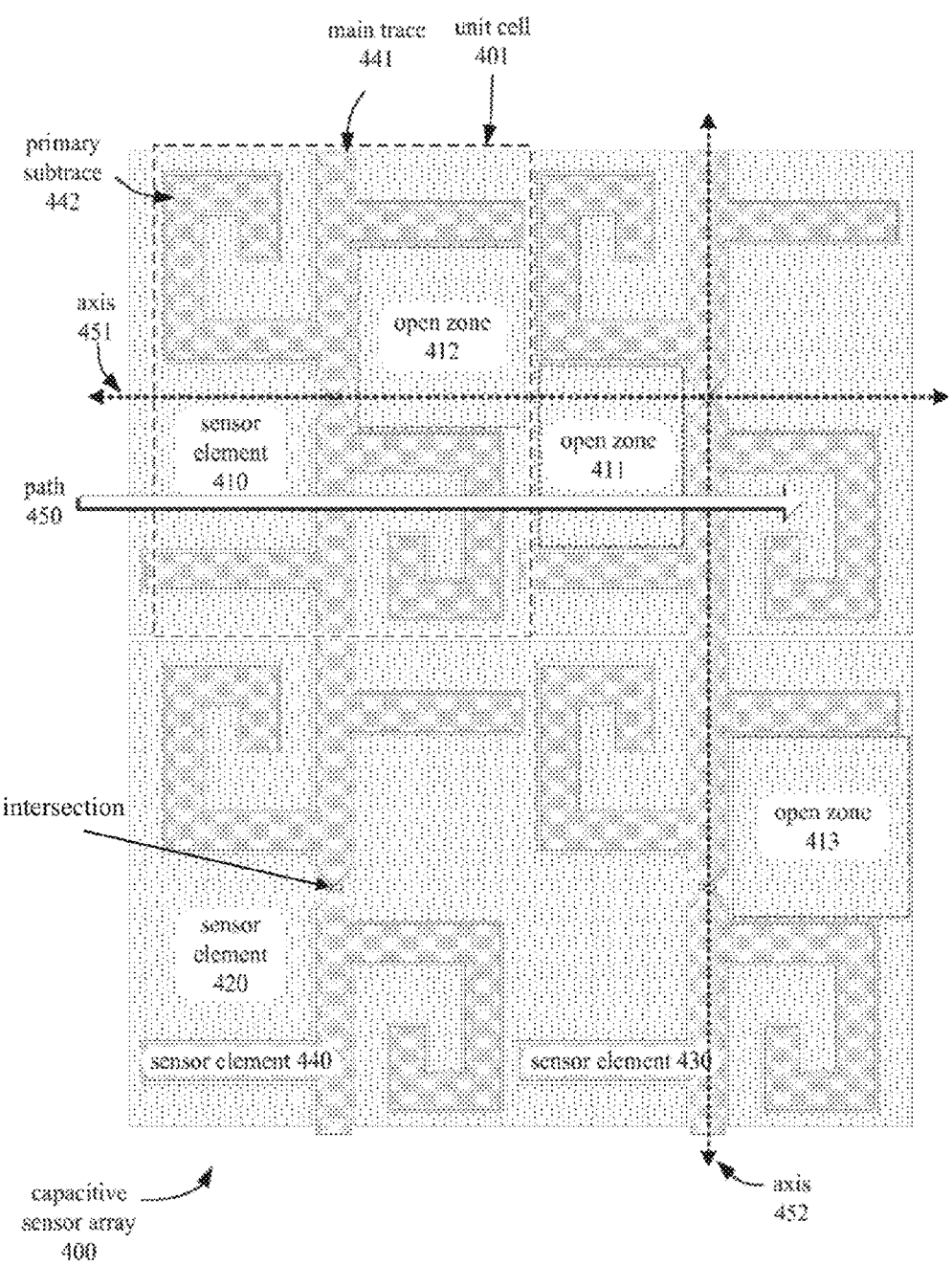
FIG. 4 illustrates an embodiment of a capacitive sensor array having staggered open zones.

FIG. 4 illustrates four unit cells of an embodiment of a capacitive sensor array having staggered open zones. In contrast with sensor array 300, a path 450 across multiple unit cells of sensor array 400 is more likely to cross higher sensitivity zones in addition to open zones, such as open zone 411. Thus, the sensor array 400 has a more uniform sensitivity over the surface of the sensor array 400, such that the accuracy for tracking a path 450 of an object may be less dependent on the position of the path 450.

Staggering of open zones as illustrated in FIG. 4 may also allow for higher detection sensitivity, particularly when the sensor array 400 is used to detect an object having a small area in contact or in proximity with the sensor array 400, such as a small diameter passive stylus. Assuming that an object, such as a stylus, is more likely to follow a straight path, a staggered arrangement of open zones reduces the likelihood that the stylus path would pass over many open zones in sequence, thus maximizing the perturbation of the mutual capacitance between sensor elements and resulting in a higher overall signal-to-noise ratio. The staggering of open zones thus enables the use of a stylus having a tip that is approximately 1 mm in diameter or less. In one embodiment, the staggering of open zones 411 and 412 does not significantly increase the resistance of the sensor element 410 that includes the open zones.

Sensor array 400 includes sensor elements 410 and 420 that intersect with sensor elements 430 and 440. Within each unit cell, each of the sensor elements 430 and 440 includes a main trace and at least one primary subtrace branching away from the main trace. For example, within unit cell 401, sensor element 440 includes a primary subtrace 442 that branches away from a main trace 441. In one embodiment, a primary subtrace may not necessarily follow a straight line, but may bend or curve, as does primary subtrace 442. Sensor element 440 also illustrates an embodiment where primary subtraces may be asymmetrical about an axis running parallel to the main trace 441.

Capacitive sensor array 400 also includes a plurality of open zones such as open zones 411 and 412. In one embodiment, the open zones 411 and 412 are defined as the areas between the primary subtraces branching from main traces of the sensor elements. For example, open zone 412 is defined as the area within unit cell 401 that is bounded by the main trace 441 primary subtraces branching from the main trace 441. In one embodiment, the boundary of open zone 412 is delineated by the largest convex polygon (approximated by a dotted line in FIG. 4) that contains portions of only one sensor element, which in this case is sensor element 410.

In one embodiment, adjacent open zones of the sensor array 400 may be positioned in a staggered arrangement. For example, open zone 412 is adjacent to open zone 411, and open zones 411 and 412 are positioned in a staggered arrangement relative to each other. In one embodiment, the open zones may be staggered by arranging the sensor pattern such that the center of mass of each successive open zone lies on alternating sides of a central axis, such as a central axis 451 of sensor element 410. In one embodiment, the central axis 451 lies along a core section of the sensor element 410, which provides a low resistance current path for current flowing through the sensor element 410. Alternatively, the central axis around which the open zones are staggered may follow a main trace of a sensor element, as axis 452 follows a main trace of sensor element 430.

In one embodiment, an open zone may be staggered with respect to adjacent open zones in more than one direction. For example, open zone 411 is staggered relative to adjacent open zone 412 on alternating sides of axis 451, while open zone 411 is also staggered relative to adjacent open zone 413 on alternating sides of axis 452.

Figure 5:
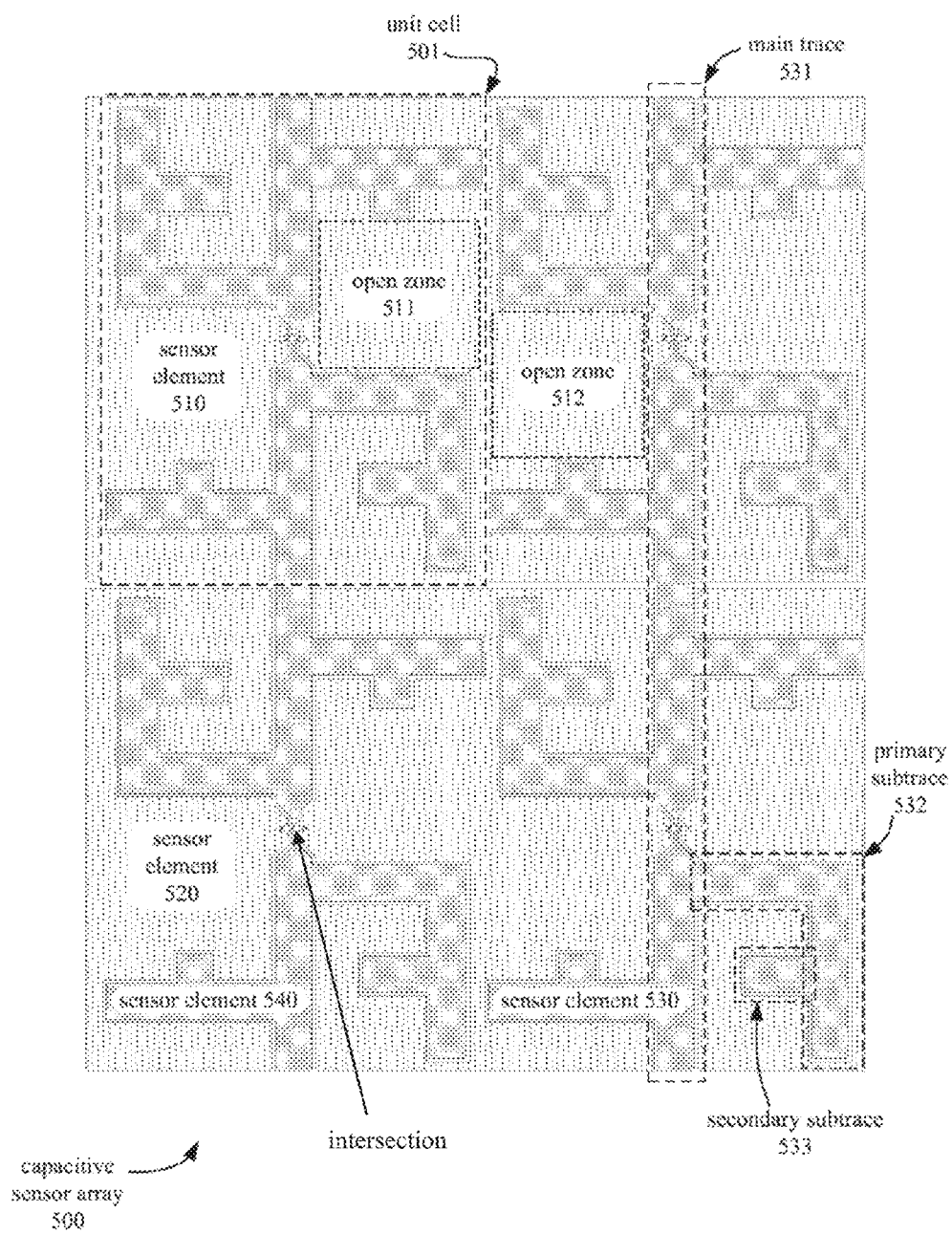
FIG. 5 illustrates an embodiment of a capacitive sensor array having staggered open zones.

FIG. 5 illustrates four unit cells, including unit cell 501, of an embodiment of a capacitive sensor array having staggered open zones. Capacitive sensor array 500 includes sensor element 510 and 520, which intersect with sensor element 530 and 540. Sensor element 510 includes a plurality of open zones, including open zones 511 and 512, that are staggered relative to each other. The open zones of other sensor elements of sensor array 500 may be similarly arranged.

In one embodiment, a sensor element may include a main trace, at least one primary subtrace branching away from the main trace, and at least one secondary subtrace branching away from the primary subtrace. For example, sensor element 530 includes a main trace 531 and a primary subtrace 532 branching away from the main trace 531. A secondary subtrace 533 branches away from the primary subtrace 532. In one embodiment, only one end of the secondary subtrace is connected to the primary subtrace. The secondary subtrace may be orthogonal to the primary subtrace at the junction between the secondary subtrace and the primary subtrace, or may be joined to the primary subtrace at a different angle. In one embodiment, a secondary subtrace may branch away from each of the primary subtraces of the sensor element. Alternatively, secondary subtraces may branch from a subset of the primary subtraces.

In one embodiment, a capacitive sensor array pattern may include sensor elements having more than one main trace.

For example, a RX sensor element may include two or more main traces to reduce the RX resistance.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A capacitive sensor array, comprising:
   a plurality of unit cells, wherein at least one of the plurality of unit cells comprising:
   a first plurality of sensor elements;
   a plurality of second sensor elements respectively comprising a main trace and one or more primary subtraces, wherein the one or more primary subtraces is substantially orthogonal to the main trace at a junction between the one or more primary subtraces and the main trace; and
   a plurality of bridges connecting portions of the first plurality of sensor elements, wherein the main trace intersects the bridges to form a plurality of intersections each associated with the first sensor element, wherein each of the plurality of unit cells designates a set of locations nearest a corresponding intersection, wherein a contiguous section of the main trace crosses at least one of the plurality of unit cells,
   wherein at least one of the first sensor elements further comprises a plurality of open zones, and each of the open zones are surrounded by the main trace and the one or more primary subtraces of each of the plurality of second sensor elements, wherein each of the open zones is staggered with a nearest adjacent identical open zone of an adjacent identical unit cell.

2. The capacitive sensor array of claim 1, wherein each open zone includes an area having decreased sensitivity relative to areas of the capacitive sensor array outside any open zone.

3. The capacitive sensor array of claim 1, wherein each of the plurality of open zones comprises an area delineated by a convex polygon and including portions of only one sensor element.

4. The capacitive sensor array of claim 1, wherein the plurality of open zones are staggered along both a first axis and a second axis perpendicular to the first axis.

5. The capacitive sensor array of claim 1, further comprising, within each unit cell, one or more secondary subtraces branching away from the one or more primary subtraces.

6. A capacitive touch-sensing system, comprising:
   a plurality of unit cells; wherein at least one of the plurality of unit cells comprising:
   a first plurality of sensor elements;
   a plurality of second sensor elements respectively comprising a main trace and one or more primary subtraces, wherein the one or more primary subtraces is substantially orthogonal to the main trace at a junction between the one or more primary subtraces and the main trace; and
   a plurality of bridges connecting portions of the first plurality of sensor elements, wherein the main trace intersects the bridges to form a plurality of intersections each associated with the first sensor element, wherein each of the plurality of unit cells designates a set of locations nearest a corresponding intersection, wherein a contiguous section of the main trace crosses at least one of the plurality of unit cells, wherein a contiguous section of the main trace crosses at least one of the plurality of unit cells,
   wherein at least one of the first sensor elements further comprises a plurality of open zones, and each of the open zones are surrounded by the main trace and the one or more primary subtraces of the plurality of second sensor elements, wherein each of the open zones is staggered with a nearest adjacent identical open zone of an adjacent identical unit cell; and
   a capacitance sensor coupled with the capacitive sensor array, wherein the capacitance sensor is configured to measure a mutual capacitance for each intersection between one of the second sensor elements and a corresponding sensor element.

7. The capacitive touch-sensing system of claim 6, wherein each open zone includes an area having decreased sensitivity relative to areas of the capacitive sensor array outside any open zone.

8. The capacitive touch-sensing system of claim 6, wherein the plurality of open zones are staggered along both a first axis and a second axis perpendicular to the first axis.

9. The capacitive touch-sensing system of claim 6, wherein each of the plurality of open zones comprises an area delineated by a convex polygon and including portions of only one sensor element.

10. The capacitive touch-sensing system of claim 6, wherein the capacitance sensor is further configured to transmit a signal on each of the first plurality of sensor elements.

11. The capacitive touch-sensing system of claim 6, further comprising, within each unit cell, one or more secondary subtraces branching away from the one or more primary subtraces.

* * * * *